(12) United States Patent
Huang et al.

(10) Patent No.: US 11,581,883 B2
(45) Date of Patent: Feb. 14, 2023

(54) SYSTEMS AND METHODS TO REDUCE DIFFERENTIAL-TO-DIFFERENTIAL FAR END CROSSTALK

(71) Applicant: Hirose Electric Co., Ltd., Kanagawa (JP)

(72) Inventors: Ching-Chao Huang, San Jose, CA (US); Jeremy Buan, San Jose, CA (US); Jingqian Tian, San Jose, CA (US); Tadashi Ohshida, Cupertino, CA (US)

(73) Assignee: Hirose Electric Co., Ltd., Kanagawa (JP)

( * ) Notice: Subject to any disclaimer, the term of this patent is extended or adjusted under 35 U.S.C. 154(b) by 0 days.

(21) Appl. No.: 17/691,804

(22) Filed: Mar. 10, 2022

(65) Prior Publication Data

US 2022/0200587 A1    Jun. 23, 2022

Related U.S. Application Data

(62) Division of application No. 17/359,149, filed on Jun. 25, 2021.

(60) Provisional application No. 63/058,326, filed on Jul. 29, 2020.

(51) Int. Cl.
*H03K 5/12* (2006.01)
*H03K 5/1252* (2006.01)
*H03K 5/00* (2006.01)

(52) U.S. Cl.
CPC . *H03K 5/1252* (2013.01); *H03K 2005/00078* (2013.01)

(58) Field of Classification Search
CPC ............... H03K 5/1252; H03K 2005/0078
See application file for complete search history.

(56) References Cited

U.S. PATENT DOCUMENTS

| 9,602,160 B2 | 3/2017 | Muljono et al. | |
| 2012/0109568 A1* | 5/2012 | M | G06F 11/24 702/124 |

OTHER PUBLICATIONS

Final Office Action for the corresponding U.S. Appl. No. 17/359,149 dated Aug. 9, 2022, 7 pages.

* cited by examiner

*Primary Examiner* — Dinh T Le
(74) *Attorney, Agent, or Firm* — Procopio, Cory, Hargreaves & Savitch LLP

(57) ABSTRACT

A method of manufacturing an electrical system for reducing differential-to-differential far end crosstalk (DDFEXT) includes converting a first S parameter representative of a design of a first electrical system into a differential-only S parameter, generating a second differential-only S parameter configured to add even-mode propagation delay and odd-mode propagation delay of the differential-only S parameter of the electrical system such that a total even-mode propagation delay and odd-mode propagation delay of the differential-only S parameter are substantially equivalent, and reconfiguring a second electrical system from the differential-only S parameter and the second differential-only S parameter.

4 Claims, 15 Drawing Sheets

SYSTEMS AND METHODS TO REDUCE DIFFERENTIAL-TO-DIFFERENTIAL FAR END CROSSTALK

CROSS REFERENCE TO RELATED APPLICATIONS

This patent application is a Divisional Application of U.S. patent application Ser. No. 17/359,149, filed on Jun. 25, 2021, which is based on and claims the benefit of priority from provisional U.S. patent application No. 63/058,326, filed on Jul. 29, 2020, the disclosure of which are hereby incorporated by reference in their entirety for all purposes.

BACKGROUND

Field

The present disclosure is generally directed to electronic systems, and more specifically, to systems and methods to reduce far end cross talk such as differential-to-differential far end crosstalk (DDFEXT).

Related Art

The reduction of FEXT can be important for high speed digital communication systems. As demand for higher bandwidth continues to grow in the telecommunication industry, each device may require massively more computational power and routing capability. The data rate for each signal channel continues to increase, as does signal density. As a result, unwanted noise, or electromagnetic coupling occurring between neighbor channels, significantly increases. For high-speed applicability and reduction in noise compared to single-ended data lines, differential signaling has become a preferred related art method for data transmission.

For the differential victim pair being considered, unwanted electromagnetic coupling (i.e., crosstalk) from neighboring aggressor pairs occurs throughout the data transmission path when at least one of these neighboring pairs is active. When an aggressor's transmitter and victim's receiver are physically far away from each other (located at different chips, for example), crosstalk induced in the same direction as the signal is called far-end crosstalk, or FEXT.

SUMMARY

Example implementations described herein are directed to systems and methods for balancing out common and differential delays so the cumulative effects of the cross talk negate each other, thereby resulting in reduced differential-to-differential FEXT.

Aspects of the present disclosure can involve an electrical system for reducing far end crosstalk (FEXT), the electrical system involving a first electrical system; and a second electrical system cascaded with the first electrical system in series, the second electrical system configured to shift propagation delay of the first electrical system to reduce FEXT. In such example implementations, the first electrical system and the second electrical system can be one or more of a connector, a cable, a printed circuit board (PCB), or a chip package. In any of the example implementations described herein, the second electrical system can involve reconfigurable hardware. In any of the example implementations to reduce differential-to-differential FEXT (DDFEXT), the reconfigurable hardware can be configured by a process involving converting a first S parameter representative of a design of the first electrical system into a differential-only S parameter; generating a second differential-only S parameter configured to shift even-mode propagation delay and odd-mode propagation of the electrical system of the differential-only S parameter to be substantially equivalent; and reconfiguring the second electrical system from the differential-only S parameter and the second differential-only S parameter. In accordance with any example implementation as described above, the second electrical system can be configured to shift propagation delay of the first electrical system to reduce differential-to-differential FEXT (DDFEXT). In accordance with an example implementation as described above, the second electrical system can be configured to shift propagation delay of the first electrical system to reduce single-ended FEXT.

Aspects of the present disclosure can involve a method of manufacturing an electrical system for reducing far end crosstalk (FEXT), the electrical system comprising a first electrical system; and a second electrical system cascaded with the first electrical system in series, the second electrical system configured to shift propagation delay of the first electrical system to reduce FEXT, the method involving converting a first S parameter representative of a design of the first electrical system into a differential-only S parameter; generating a second differential-only S parameter configured to shift even-mode propagation delay and odd-mode propagation of the electrical system of the differential-only S parameter to be substantially equivalent; and reconfiguring the second electrical system from the differential-only S parameter and the second differential-only S parameter. In accordance with any example implementation as described above, the second electrical system can be configured to shift propagation delay of the first electrical system to reduce differential-to-differential FEXT (DDFEXT). In accordance with an example implementation as described above, the second electrical system can be configured to shift propagation delay of the first electrical system to reduce single-ended FEXT.

Aspects of the present disclosure can involve an electrical system for reducing far end crosstalk (FEXT), the electrical system involving a first electrical system; and a second electrical system cascaded with the first electrical system in series, the second electrical system configured to compensate even-mode and odd-mode propagation delay difference of the first electrical system to reduce FEXT.

Aspects of the present disclosure can involve a method of manufacturing an electrical system for reducing differential-to-differential far end crosstalk (DDFEXT), the electrical system involving a first electrical system; and a second electrical system cascaded with the first electrical system in series, the second electrical system configured to add even-mode and odd-mode propagation delays of differential-only S parameter to the first electrical system to reduce DDFEXT, the method involving converting a first S parameter representative of a design of the first electrical system into a differential-only S parameter; generating a second differential-only S parameter configured to add even-mode propagation delay and odd-mode propagation delay of the differential-only S parameter of the electrical system such that the total even-mode propagation delay and odd-mode propagation delay of the differential-only S parameter are substantially equivalent; and reconfiguring the second electrical system from the differential-only S parameter and the second differential-only S parameter.

Aspects of the present disclosure include a method of manufacturing an electrical system for reducing far end crosstalk (FEXT), the electrical system involving a first electrical system; and a second electrical system cascaded with the first electrical system in series, the second electrical system configured to add even- and odd-mode propagation delays to the first electrical system to reduce FEXT, the method including generating a second S parameter configured to add even-mode propagation delay and odd-mode propagation delay of the electrical system such that the total even-mode propagation delay and odd-mode propagation delay are substantially equivalent; and reconfiguring the second electrical system from the S parameter and the second S parameter.

DETAILED DESCRIPTION

Figure 1:
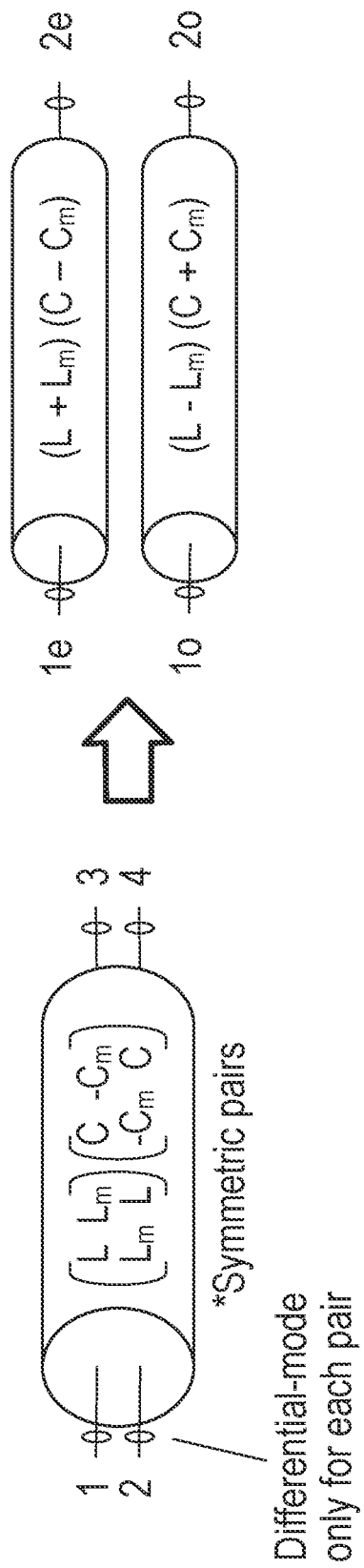
FIG. 1 illustrates an example of decoupling coupled differential pairs to extend even/odd mode analysis to pair-to-pair coupling, in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. Example implementations described herein may be used singularly, or in combination other example implementations described herein, or with any other desired implementation.

FIG. 1 illustrates an example of decoupling coupled differential pairs to extend even/odd mode analysis to pair-to-pair coupling, in accordance with an example implementation. In example implementations, the differential pairs are assumed to be symmetric to simplify the analysis. Two symmetric differential pairs (pair 1, pair 2) can be represented as differential ports 1, 2, 3, and 4 as illustrated in FIG. 1. To analyze the system, the symmetric differential pairs are divided into two coupled pairs which can then be analyzed by using even mode and odd mode analysis. The results of the even mode and the odd mode analysis can be combined to derive the DDFEXT and differential-to-differential near end cross talk (DDNEXT).

To facilitate the analysis for reducing DDFEXT, the analysis to determine for the product of the S-parameter and the incident voltage is equal to the outgoing voltage as follows:

$$\begin{pmatrix} S_{11} S_{12} S_{13} S_{14} \\ S_{21} S_{22} S_{23} S_{24} \\ S_{31} S_{32} S_{33} S_{34} \\ S_{41} S_{42} S_{43} S_{44} \end{pmatrix} \begin{pmatrix} V_1^+ \\ V_2^+ \\ V_3^+ \\ V_4^+ \end{pmatrix} = \begin{pmatrix} V_1^- \\ V_2^- \\ V_3^- \\ V_4^- \end{pmatrix} \quad (1)$$

In the above equation (1), the outgoing voltage is represented with the negative superscript sign, and the incident voltage is represented with a positive superscript sign. Thus, in the example of FIG. 1, if there are four differential ports, there is incident voltage entering each port and outgoing voltage coming out of each port. The analysis is extended to differential signals as shown because here, the S-parameters with the same value (e.g., S11) represents the differential signal within the same differential port, and the S-Parameters with different port represents the transmission or coupling between the corresponding differential ports (e.g., S12 represents differential coupling from differential port 2 to differential port 1). Note that for single-ended application, the S-parameters with the same value (e.g., S11) represents the single-ended signal within the same port, and the S-Parameters with different port represents the transmission or coupling between the corresponding single-ended ports (e.g., S12 represents the coupling from single-ended port 2 to single-ended port 1).

For the even mode analysis, set the incident voltage into two corresponding ports to be identical, and let $V_2^+=V_1^+$; $V_4^+=V_3^+$. The even mode analysis can thereby simplify the original 4×4 matrix into a 2×2 matrix as the incident voltages are the same, and can be determined as follows:

$$\frac{1}{2}\begin{pmatrix} S_{11}+S_{12}+S_{21}+S_{22} & S_{13}+S_{14}+S_{23}+S_{24} \\ S_{31}+S_{32}+S_{41}+S_{42} & S_{33}+S_{34}+S_{43}+S_{44} \end{pmatrix}\begin{pmatrix} V_1^+ \\ V_3^+ \end{pmatrix} = \quad (2)$$

$$\frac{1}{2}\begin{pmatrix} V_1^-+V_2^- \\ V_3^-+V_4^- \end{pmatrix} = \begin{pmatrix} V_{1,even}^- \\ V_{3,even}^- \end{pmatrix}$$

For the odd mode analysis, set the incident voltage into two corresponding ports at a 180 degree phase reversal, and let $V_2^+=V_1^+$; $V_4^+=-V_3^+$. The odd mode analysis can thereby simplify the original 4×4 matrix into a 2×2 matrix as follows:

$$\frac{1}{2}\begin{pmatrix} S_{11}-S_{12}-S_{21}+S_{22} & S_{13}-S_{14}-S_{23}+S_{24} \\ S_{31}-S_{32}-S_{41}+S_{42} & S_{33}-S_{34}-S_{43}+S_{44} \end{pmatrix}\begin{pmatrix} V_1^+ \\ V_3^+ \end{pmatrix} = \quad (3)$$

$$\frac{1}{2}\begin{pmatrix} V_1^--V_2^- \\ V_3^--V_4^- \end{pmatrix} = \begin{pmatrix} V_{1,odd}^- \\ V_{3,odd}^- \end{pmatrix}$$

In example implementations, to determine the DDNEXT, the analysis can be simplified towards the propagation going from the transmission side into the receiving side. Thus, it is assumed that there is no incident voltage coming in from the receiving side, so let the incident voltage at the receiving end equal zero, so that the DDNEXT is the differential ($V_2^-$) of the even mode and odd mode voltages of the aggressor pair coming out from the transmission end as follows:

$$V_3^+ = 0 \rightarrow V_2^- = V_{1,even}^- - V_{1,odd}^- \qquad (4)$$

Similarly, the DDFEXT can thereby be represented as the differential ($V_4^-$)) of the even mode and odd mode analysis of the aggressor pair coming out from the receiving end as follows:

$$V_4^- = V_{3,even}^- - V_{3,odd}^- \qquad (5)$$

Figure 2:
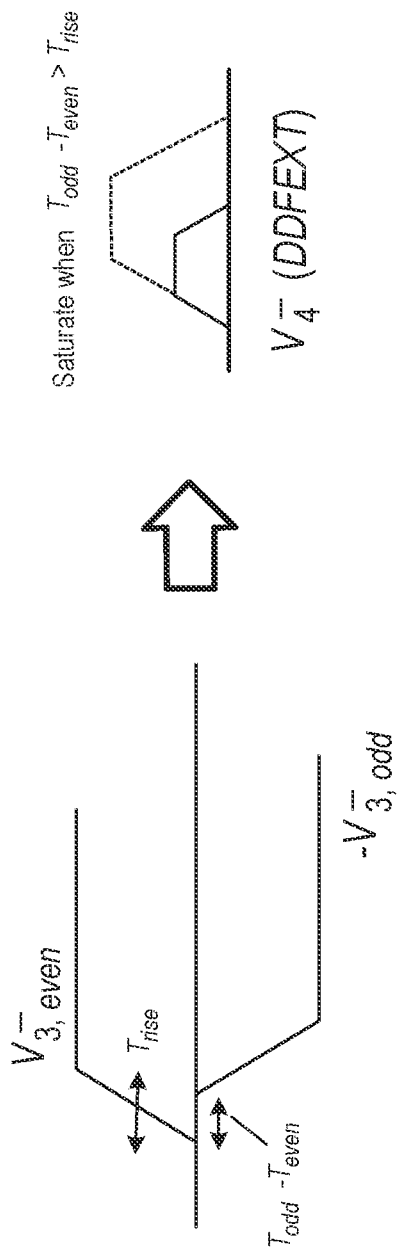
FIG. 2 illustrates an example of the propagation delay to be reduced for reducing DDFEXT, in accordance with an example implementation.

FIG. 2 illustrates an example of the propagation delay to be adjusted for reducing DDFEXT, in accordance with an example implementation. As illustrated in FIG. 2, when the difference between the even mode propagation delay and the odd mode propagation delay are different, the couplings will induce DDFEXT at the receiving end as the differential between the even mode and the odd mode will not be zero. However, if the couplings are the same and DDFEXT is zero, then the difference between even mode and odd mode propagation delay will also be zero. Thus, example implementations described herein are directed to eliminating the difference between the even mode propagation delay and the odd mode propagation delay to reduce DDFEXT.

Referring to FIG. 1, the even mode and odd mode propagation delays can be represented as:

$$T_{even} = \sqrt{(L+L_m)(C-C_m)}; T_{odd} = \sqrt{(L-L_m)(C+C_m)}$$

where L and C are self inductance and capacitance and Lm and Cm are mutual inductance and capacitance.
Thus:

$$\text{If } \frac{L_m}{L} = \frac{C_m}{C} \rightarrow T_{even} = T_{odd} \rightarrow V_4^-(DDFEXT) = V_{3,even}^- - V_{3,odd}^- = 0$$

Figure 3A:
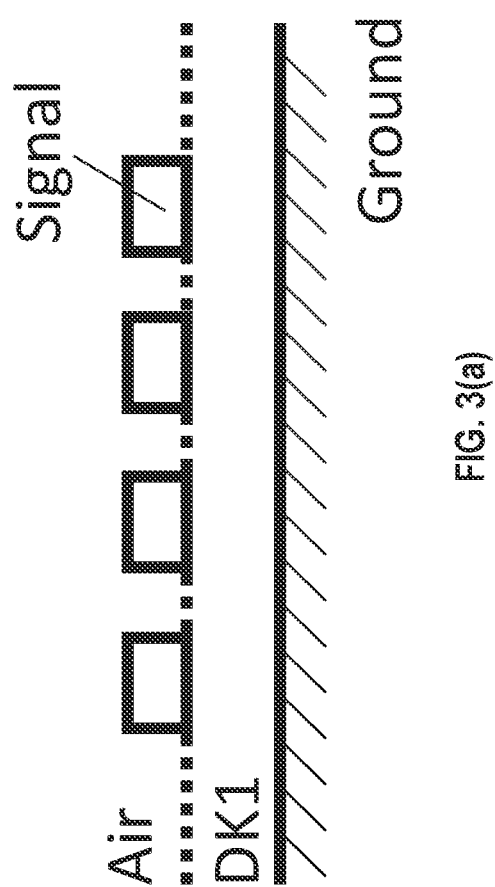
FIGS. 3(a) to 3(c) illustrate an example design with a one-inch microstrip, in accordance with an example implementation.
Figure 3B:
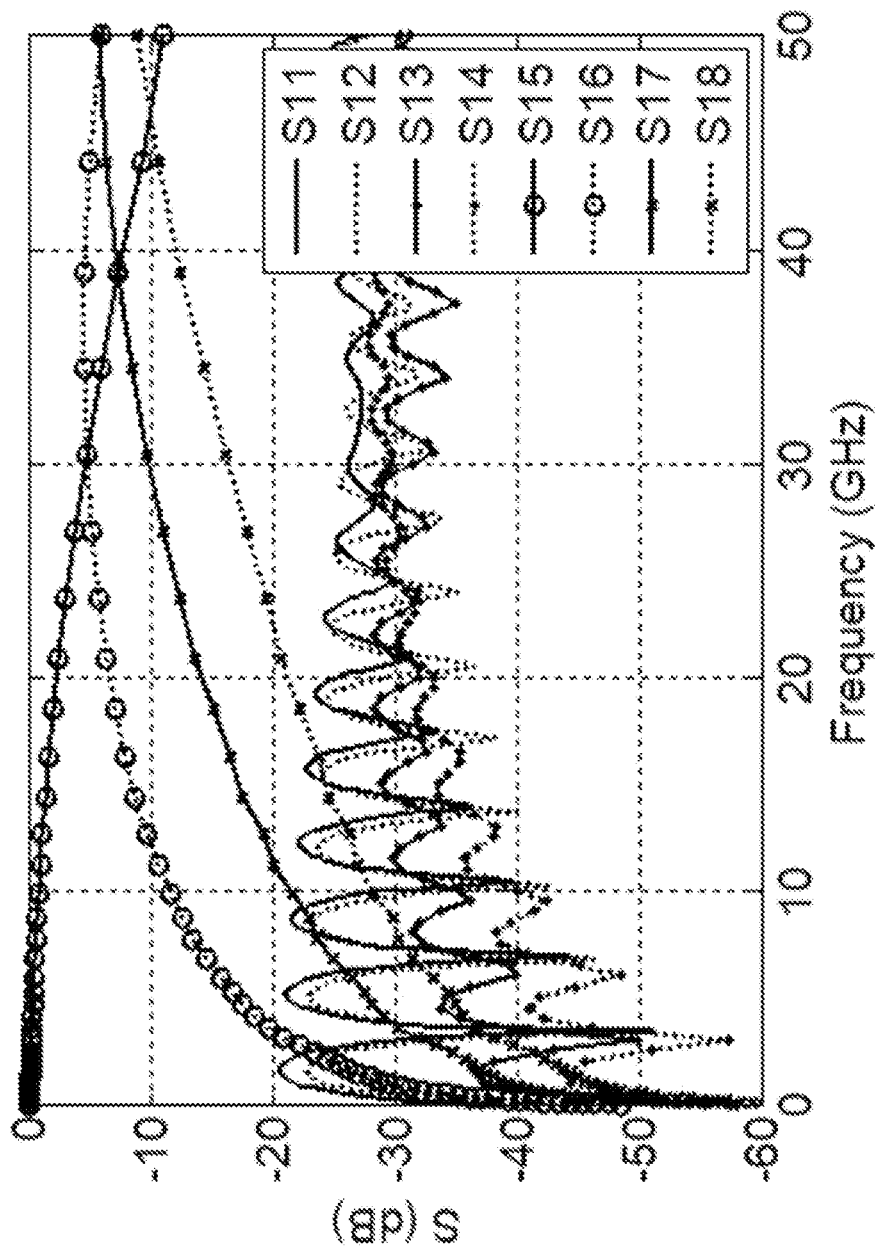
Figure 3C:
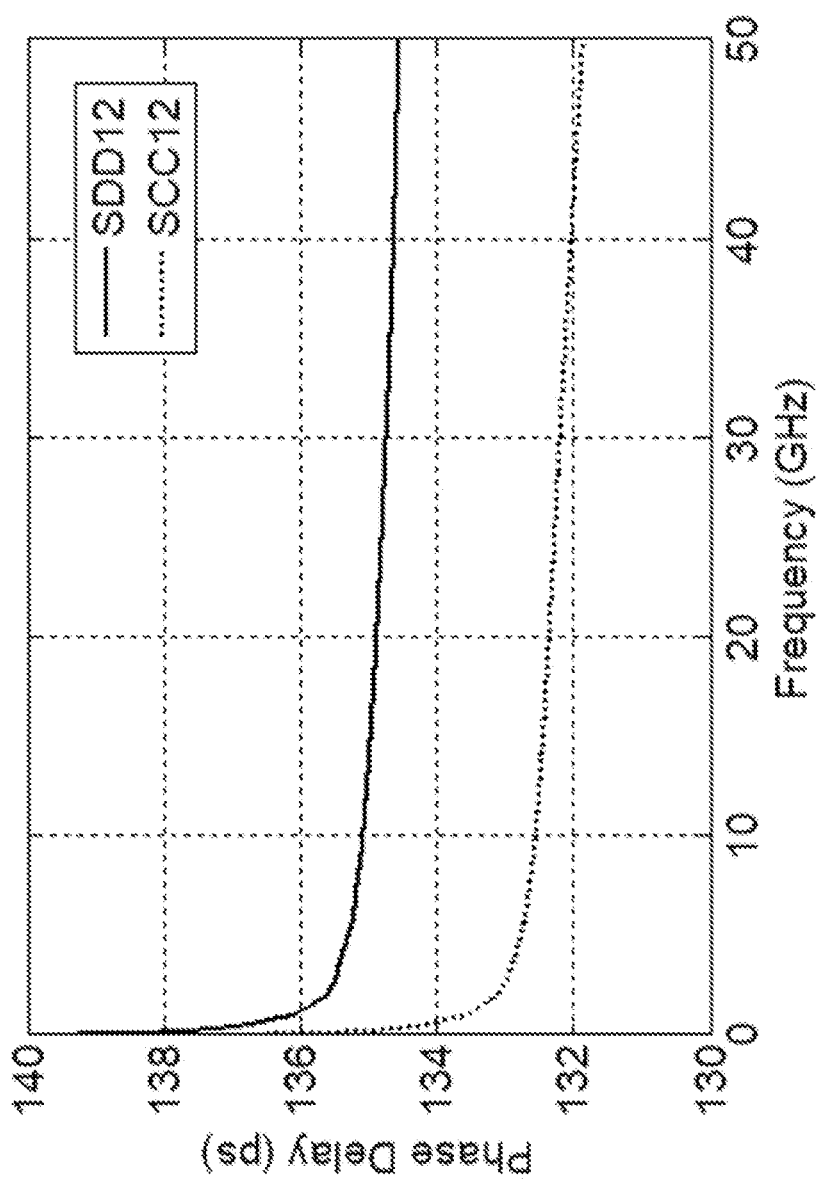

When $$\frac{L_m}{L} < \frac{C_m}{C}$$

then $T_{even} < T_{odd}$ which will result in DDFEXT greater than zero as $V_4^-$(DDFEXT)=$V_{3,even}^- - V_{3,odd}^- > 0$ Thus, In example implementations as described herein, one technique to analyze and reduce DDFEXT is to convert the simulated or measured Touchstone files of multi-port systems (e.g., .sNp) into a differential-only touchstone file (.snp) (n=N/2) and then modify the design to make the even- and odd-mode propagation delays of differential-only S parameters close to each other, which can be conducted by examining the common and differential phase or group delays or time domain transmission (TDT) delays of differential-only S parameters. To this end, the example implementations will take into consideration the following terms:
SDD—the differential-only S parameters
SDD of SDD—the differential modes of differential-only S parameters
SCC of SDD—the common modes of differential-only S parameters FIGS. 3(a) to 3(c) illustrate an example design with a one-inch microstrip, in accordance with an example implementation. Specifically, FIG. 3(a) illustrates an example cross section of a one-inch microstrip. In this design there are two differential pairs which therefore involves four signal lines. The four signal lines are typically metal lines that are deposited on top of a substrate, and involve a four lines in, four lines out system for eight ports.

FIG. 3(b) illustrates an example of the single-ended S parameters in FIG. 3(a). Taking the eight port S parameters and converting it into differential only mode through the examples described above, the delay of the odd mode and the even mode can be plotted and the difference can be determined, as illustrated in SDD12 of FIG. 3(c) which indicates that the differential delay is larger than the common mode delay. FIG. 3(c) illustrates an example of the phase delay of SDD12 and SCC12 of differential-only S parameters.

Figure 4A:
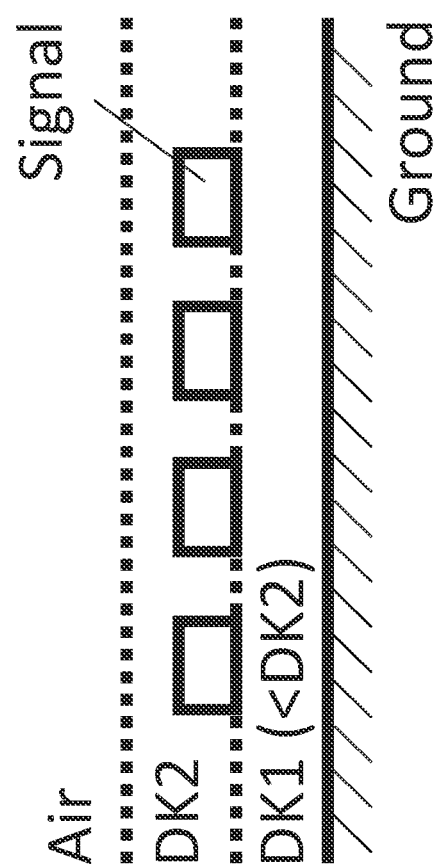
FIGS. 4(a) to 4(c) illustrate an example system of a delay shifter through a ½ inch microstrip, in accordance with an example implementation.
Figure 4B:
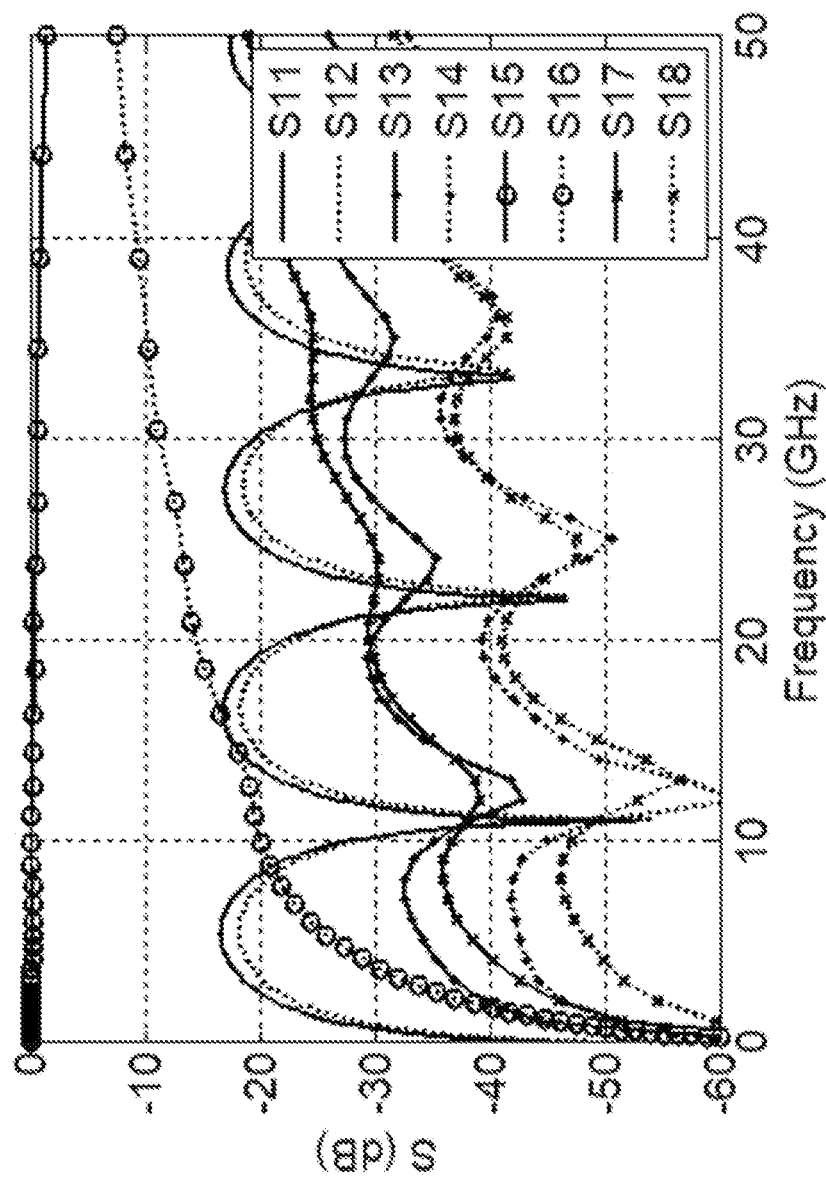
Figure 4C:
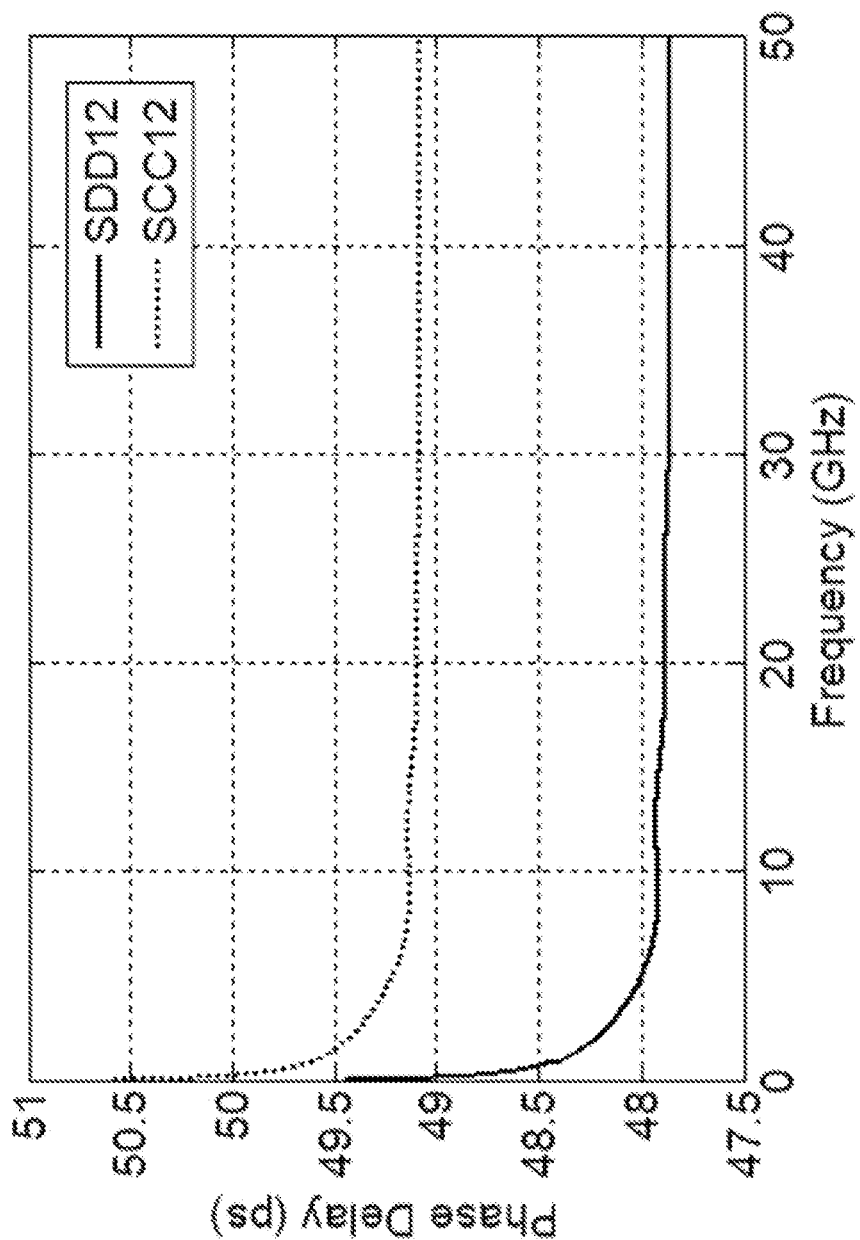

FIGS. 4(a) to 4(c) illustrate an example system of a delay shifter through a ½ inch microstrip, in accordance with an example implementation. Suppose the system of FIG. 3(a) is split into two parts involving a ½ inch original microstrip, and then another ½ inch utilized as a delay shifter or delay inverter as illustrated in FIG. 4(a). Such a structure can involve for example, using a material with a larger dielectric constant (DK2) among the strips, or so on.

In an example implementation as illustrated in FIG. 4(a) where a larger dielectric material is used between the signal lines, the single-ended S parameters are illustrated in FIG. 4(b) and the delay becomes inverted as illustrated in FIG. 4(c); the SCC12 of SDD now has larger delay than SDD12 of SDD, i.e., the common mode delay of SDD now has larger delay than differential delay of SDD as illustrated in FIG. 4(c) versus the delay in FIG. 3(c). Thus, when this system is cascaded with one half the system of FIG. 3(a), the structure of FIG. 4(a) will offset the delay from one half the structure of FIG. 3(a), resulting in DDFEXT cancellation due to the cancellation of delays.

Figure 5:
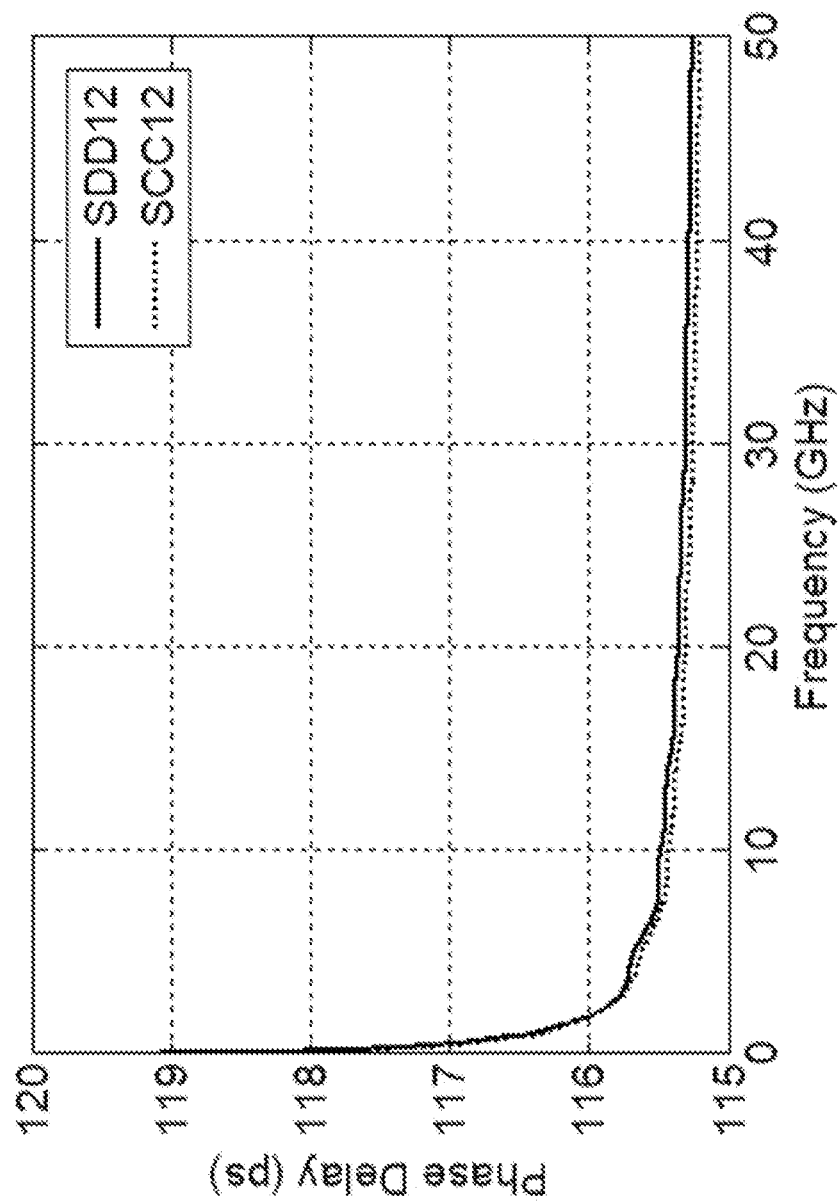
FIG. 5 illustrates an example cascading of the system of FIG. 4(a) with one half of the system of FIG. 3(a), resulting in DDFEXT reduction, in accordance with an example implementation.

FIG. 5 illustrates an example cascading of the system of FIG. 4(a) with one half of the system of FIG. 3(a), resulting in DDFEXT reduction, in accordance with an example implementation. By cascading a ½ inch microstrip design of that of FIG. 4(a) with the design of FIG. 3(a), the SCC of SDD and SDD of SDD propagation delays can be made to be similar, and thus the DDFEXT can be reduced.

Figure 6A:
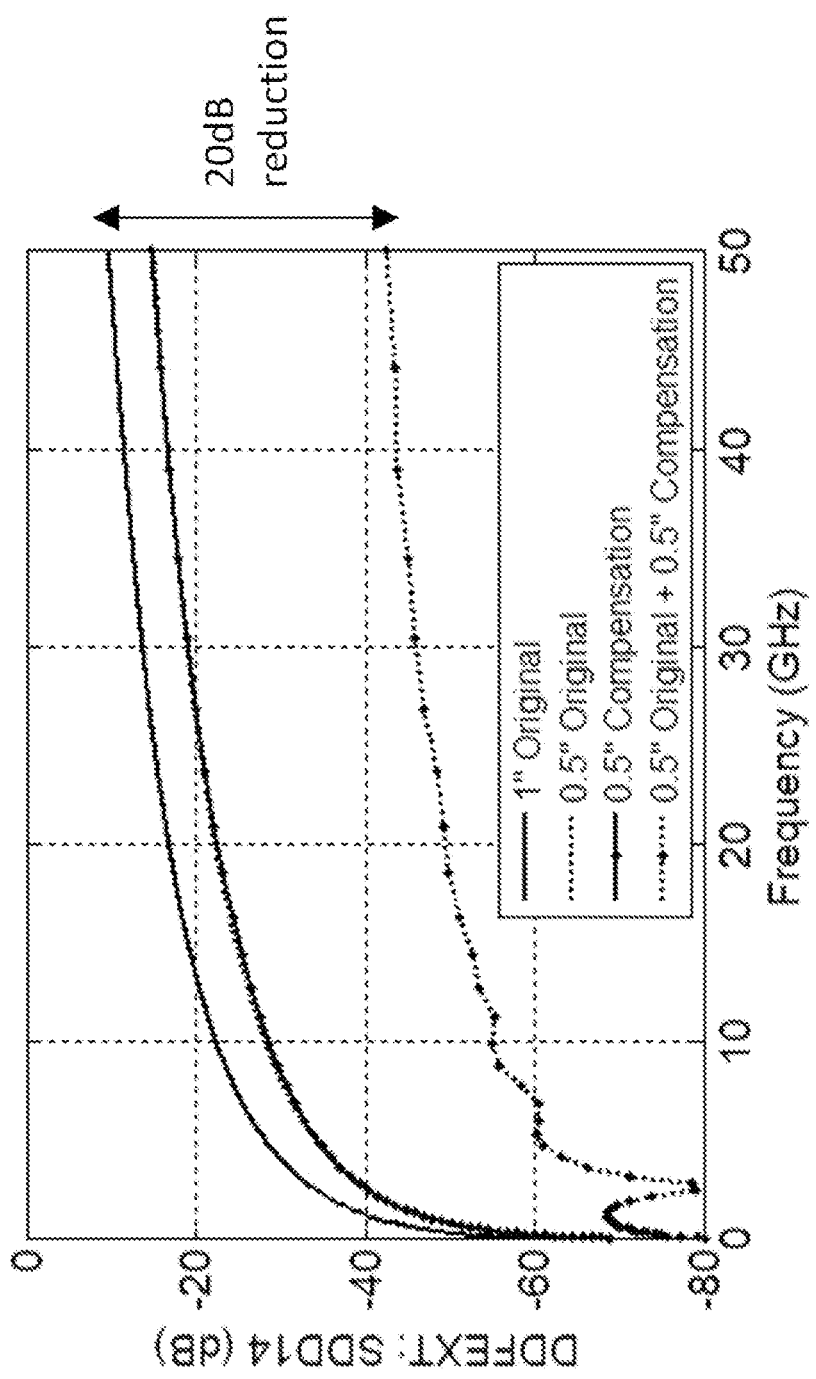
FIGS. 6(a) to 6(d) illustrate an example comparison of DDFEXT and DDNEXT, in accordance with an example implementation.
Figure 6B:
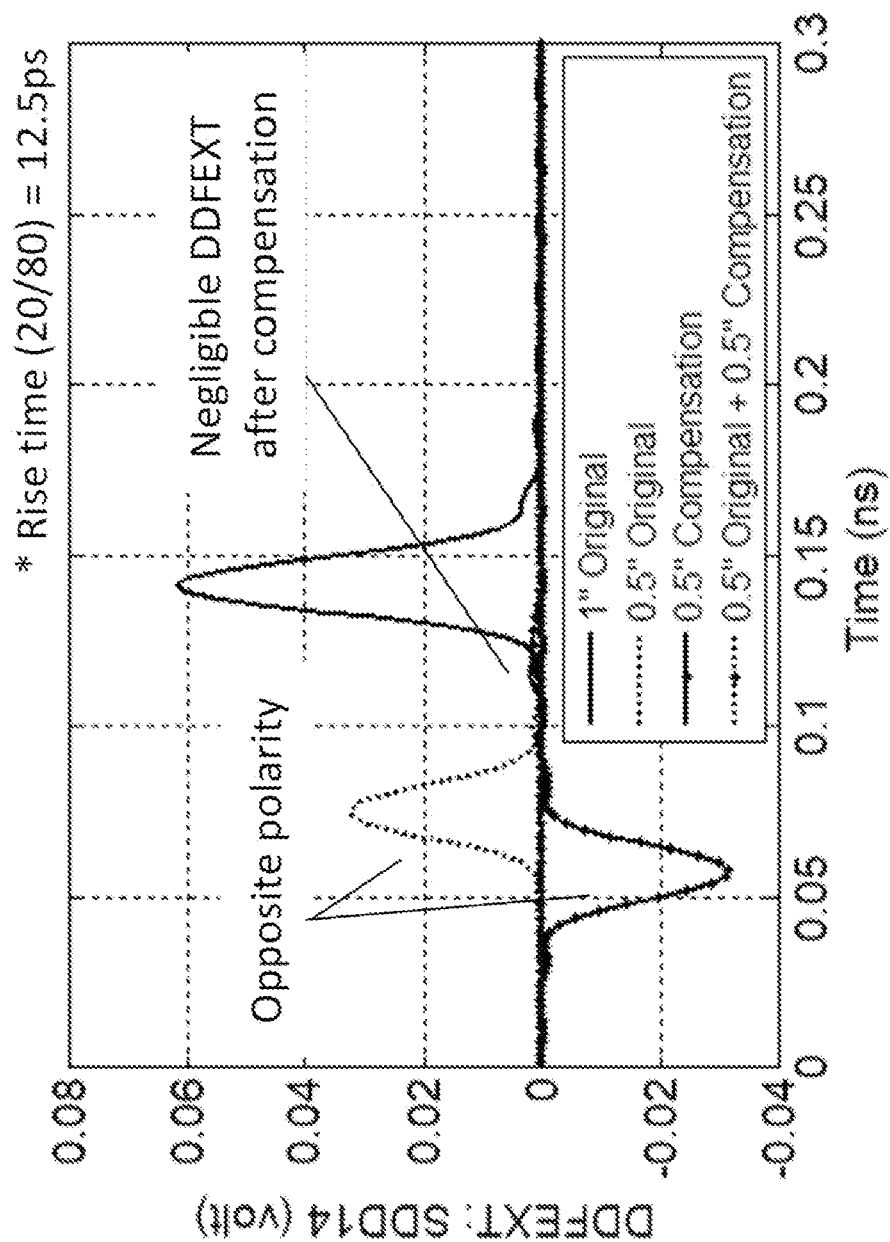
Figure 6C:
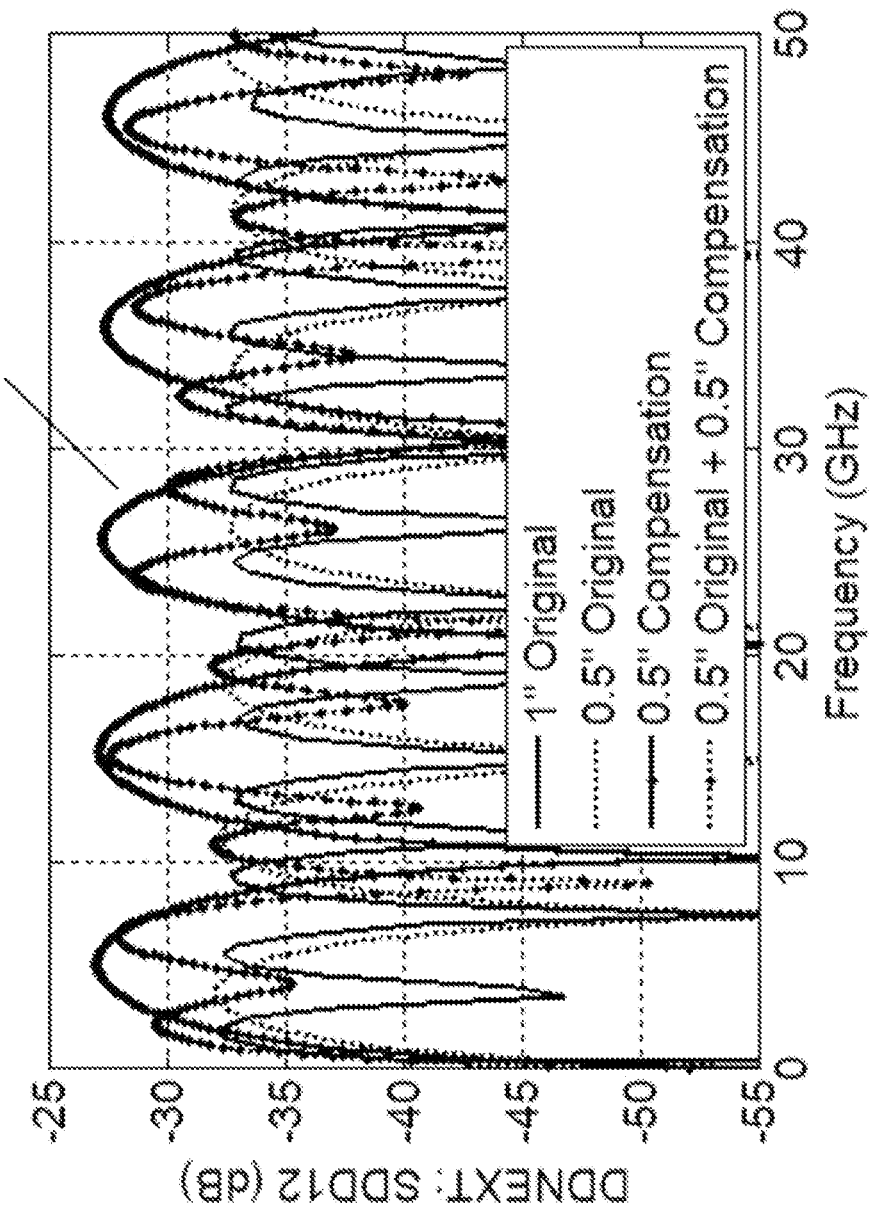
Figure 6D:
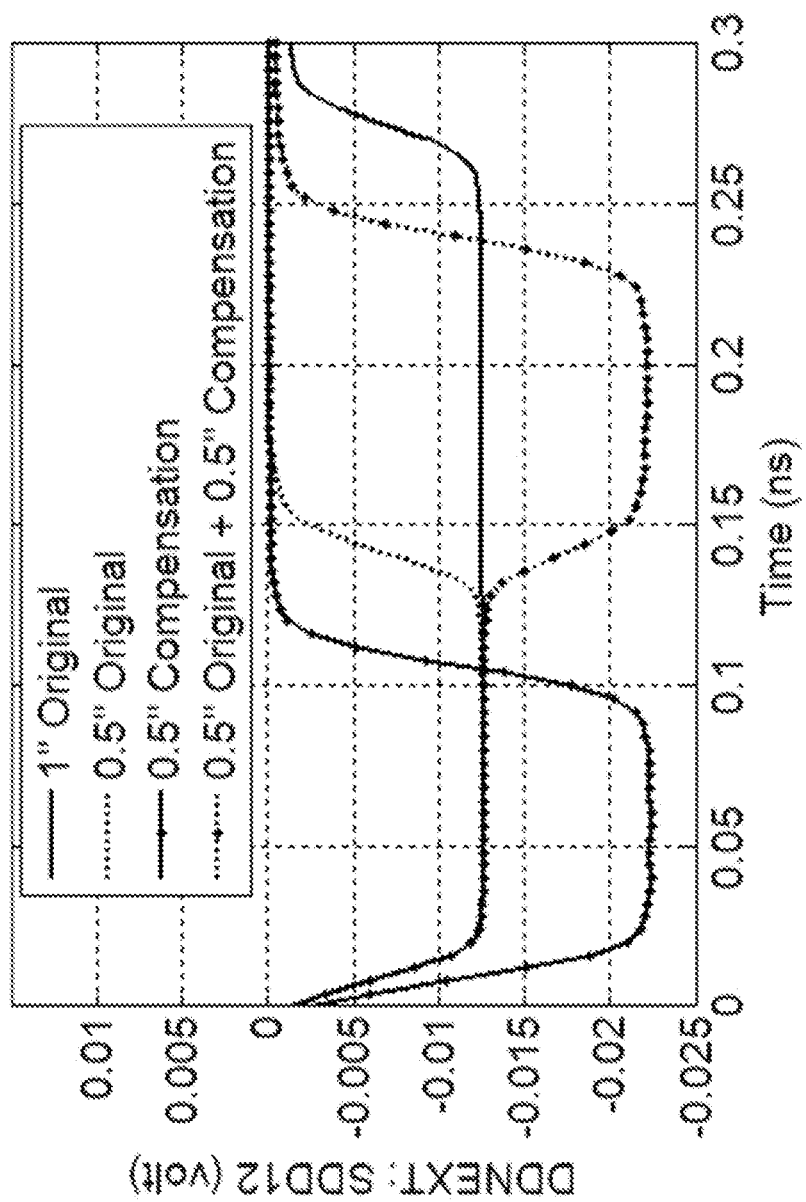

FIGS. 6(a) to 6(d) illustrate an example comparison of DDFEXT and DDNEXT, in accordance with an example implementation. As illustrated in FIGS. 6(a) to 6(b), the DDFEXT can be reduced through cascading the systems of one half of the system of FIG. 3(a) and FIG. 4(a) as the DDFEXT induced from each system will have opposite polarity. FIGS. 6(c) to 6(d) illustrate the DDNEXT, in accordance with an example implementation, which can increase, but is a good trade-off for reducing DDFEXT.

Thus, through the implementations as described herein, the example implementations can involve the balancing of common and differential delays of differential-only S parameters to reduce DDFEXT.

In addition, example implementations can involve altering the design (e.g., through applying an air gap/pocket or materials of higher dielectric constant at proper locations, adjusting the center ground location, etc.), to balance the common and differential delays of differential-only S parameters to reduce DDFEXT.

Example implementations can involve utilizing a discrete or embedded block to function as a delay shifter or delay inverter to reduce DDFEXT for any component (e.g., connector, package, printed circuit board, etc.) in accordance with the desired implementation.

Although the example implementations described herein are provided with respect to DDFEXT, the example implementations described herein can also be utilized to single-ended FEXT reduction through similar cascading systems to achieve the appropriate propagation delay.

Figure 7:
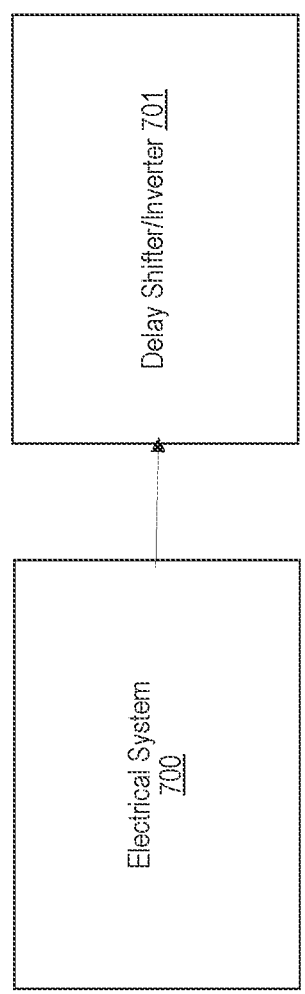
FIG. 7 illustrates an example cascaded system, in accordance with an example implementation.

FIG. 7 illustrates an example cascaded system, in accordance with an example implementation. In example implementations described herein, any electrical system 700 can be cascaded with a delay inverter/shifter 701 configured to shift the differential propagation delay to balance the common and differential delays to reduce differential FEXT. The electrical system can be any electrical system involving microstrip traces in accordance with the desired implementation, such as, but not limited to, chip package, connectors, printed circuit boards, cables, and so on. Similarly, the delay inverter/shifter 701 can be implemented through any electrical system, such as, but not limited to, a chip package, connectors, printed circuit boards, cables, and so on. In an example implementation, the delay inverter/shifter 701 can take the form of any fixed hardware in the form of an embedded or individual component in accordance with the desired implementation.

Furthermore, electrical system 700 and delay inverter/shifter 701 can be in the form of subsystems or subsections of an overall system. For example, electrical system 700 can involve multiple sections of a particular cable or connector, and delay inverter/shifter 701 can involve multiple cascaded sections within the same cable or connector. The design of the electrical system 700 and the delay inverter/shifter 701 can be set in accordance with the desired implementation.

In an example implementation, the delay inverter/shifter 701 can be in the form of a reconfigurable system configured to be changed in accordance with the desired differential delay properties. For example, the reconfigurable system can be in the form of a field-programmable gate array (FPGA) with reconfigurable interconnects that can be re-routed according to the desired differential delay properties based on a configuration with a computing device as described in FIG. 8. In another example implementation, the reconfigurable system can be in the form of microstrip traces with materials that have configurable dielectric constants (e.g., driven by voltage, by ultrasound, etc.) in accordance with the desired implementation. Such materials can involve, but is not limited to, p/n doped silicon. Other reconfigurable hardware can be utilized for the delay inverter/shifter 701 to facilitate the desired implementation, and the present disclosure is not particularly limited thereto.

In another example implementation, the delay inverter/shifter 701 can be a statically formed component designed to address the FEXT of the electrical system 700. The delay inverter/shifter 701 can be manufactured through any desired implementation known in the art based on the design of the first electrical system, through a process involving converting a first S parameter representative of a design of the first electrical system into a differential-only S parameter; generating a second differential-only S parameter configured to shift even-mode propagation delay and odd-mode propagation of the electrical system of the differential-only S parameter to be substantially equivalent; and reconfiguring the second electrical system from the differential-only S parameter and the second differential-only S parameter. Although the examples described herein are directed to DDFEXT, the example implementations can be extended to single ended FEXT as well. One of ordinary skill in the art can configure or adjust the delay inverter/shifter 701 in accordance with any desired implementation known in the art based on the examples described herein to address single ended FEXT instead of, or in conjunction with DDFEXT.

Figure 8:
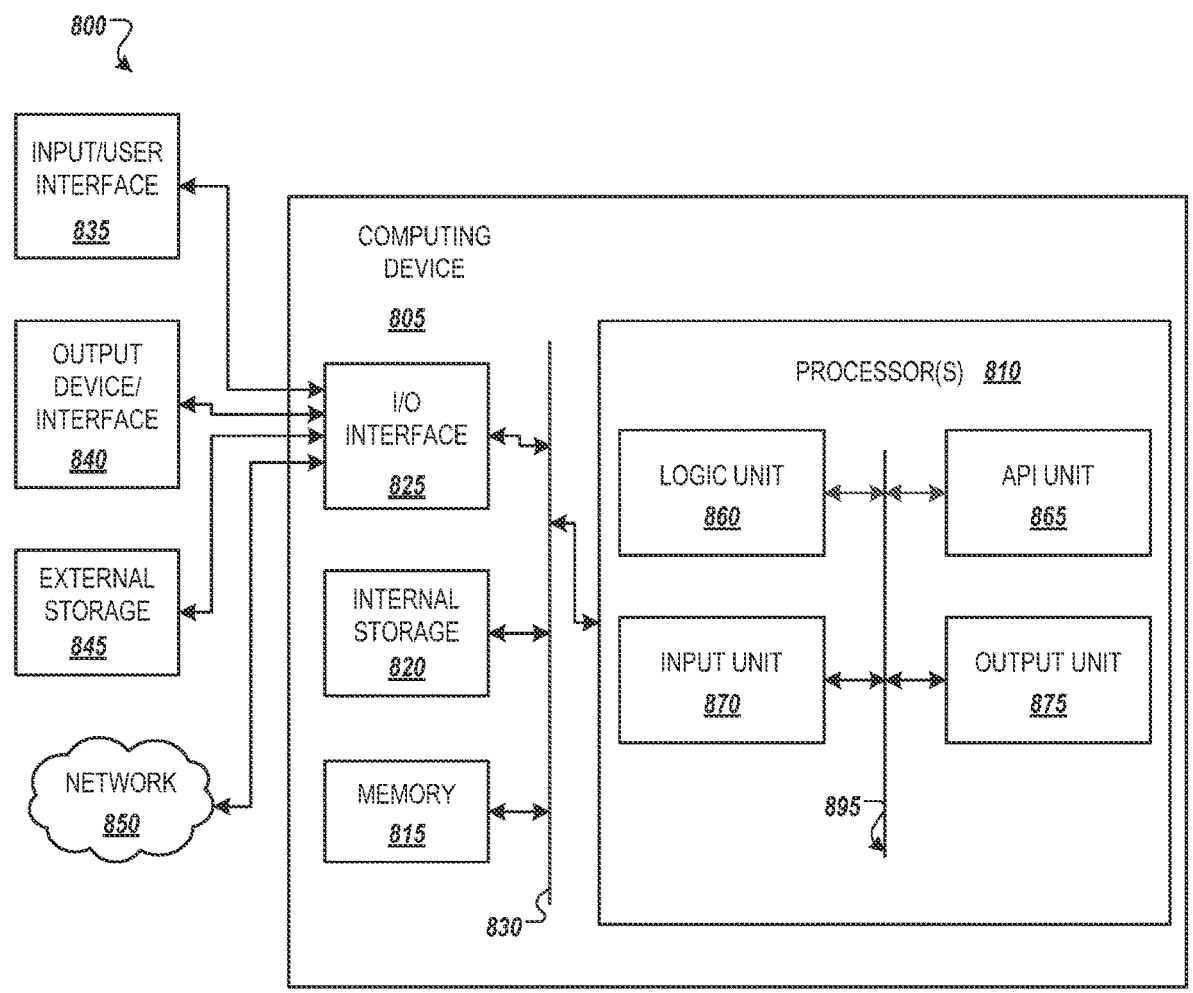
FIG. 8 illustrates an example computing environment with an example computer device suitable for use in some example implementations, such as a design tool software for generating a design and a delay shifter/inverter as described herein.

FIG. 8 illustrates an example computing environment with an example computer device suitable for use in some example implementations, such as a design tool for generating a design and a delay shifter/inverter as described herein. Computer device 805 in computing environment 800 can include one or more processing units, cores, or processors 810, memory 815 (e.g., RAM, ROM, and/or the like), internal storage 820 (e.g., magnetic, optical, solid state storage, and/or organic), and/or IO interface 825, any of which can be coupled on a communication mechanism or bus 830 for communicating information or embedded in the computer device 805. IO interface 825 is also configured to receive images from cameras or provide images to projectors or displays, depending on the desired implementation.

Computer device 805 can be communicatively coupled to input/user interface 835 and output device/interface 840. Either one or both of input/user interface 835 and output device/interface 840 can be a wired or wireless interface and can be detachable. Input/user interface 835 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 840 may include a display, television, monitor, printer, speaker, braille, or the like. In some example implementations, input/user interface 835 and output device/interface 840 can be embedded with or physically coupled to the computer device 805. In other example implementations, other computer devices may function as or provide the functions of input/user interface 835 and output device/interface 840 for a computer device 805.

Examples of computer device 805 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 805 can be communicatively coupled (e.g., via IO interface 825) to external storage 845 and network 850 for communicating with any number of networked components, devices, and systems, including one or more computer devices of the same or different configuration. Computer device 805 or any connected computer device can be functioning as, providing services of, or referred to as a server, client, thin server, general machine, special-purpose machine, or another label.

IO interface 825 can include, but is not limited to, wired and/or wireless interfaces using any communication or IO protocols or standards (e.g., Ethernet, 802.11x, Universal System Bus, WiMax, modem, a cellular network protocol, and the like) for communicating information to and/or from at least all the connected components, devices, and network in computing environment 800. Network 850 can be any network or combination of networks (e.g., the Internet, local area network, wide area network, a telephonic network, a cellular network, satellite network, and the like).

Computer device 805 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 805 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C #, Java, Visual Basic, Python, Perl, JavaScript, and others).

Processor(s) 810 can execute under any operating system (OS) (not shown), in a native or virtual environment. One or more applications can be deployed that include logic unit 860, application programming interface (API) unit 865, input unit 870, output unit 875, and inter-unit communication mechanism 895 for the different units to communicate with each other, with the OS, and with other applications (not shown). The described units and elements can be varied in design, function, configuration, or implementation and are not limited to the descriptions provided. Processor(s) 810 can be in the form of hardware processors such as central processing units (CPUs) or in a combination of hardware and software units.

In some example implementations, when information or an execution instruction is received by API unit 865, it may be communicated to one or more other units (e.g., logic unit 860, input unit 870, output unit 875). In some instances, logic unit 860 may be configured to control the information flow among the units and direct the services provided by API unit 865, input unit 870, output unit 875, in some example implementations described above. For example, the flow of one or more processes or implementations may be controlled by logic unit 860 alone or in conjunction with API unit 865. The input unit 870 may be configured to obtain input for the calculations described in the example implementations, and the output unit 875 may be configured to provide output based on the calculations described in example implementations.

Processor(s) 810 can be configured to convert a first S parameter representative of a design of a first electrical system into a differential-only S parameter; generate a second differential-only S parameter configured to shift even-mode propagation delay and odd-mode propagation of the electrical system of the differential-only S parameter to be substantially equivalent; and reconfigure the second electrical system from the differential-only S parameter and the second differential-only S parameter as illustrated in FIGS. 1-7. The second electrical system can be output via a register-transfer level (RTL) format, a hardware description language (HDL) format, or other formats for incorporation into a reconfigurable delay shifter/inverter system 701 as illustrated in FIG. 7.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

In a first aspect, there can be an electrical system for reducing differential-to-differential far end crosstalk (DD-FEXT), the electrical system comprising a first electrical system; and a second electrical system cascaded with the first electrical system in series, the second electrical system configured to shift propagation delay of the first electrical system to reduce DDFEXT.

In a second aspect, there can be an electrical system as disclosed in the first aspect wherein the first electrical system and the second electrical system are one or more of a connector, a cable, a printed circuit board (PCB), or a chip package.

In a third aspect, there can be an electrical system as disclosed in any of the first and second aspects, wherein the second electrical system involves reconfigurable hardware.

In a fourth aspect, there can be an electrical system as disclosed in any of the first, second, and third aspects, wherein the reconfigurable hardware is configured by a process involving converting a first S parameter representative of a design of the first electrical system into a differential-only S parameter; generating a second differential-only S parameter configured to shift even-mode propagation delay and odd-mode propagation of the electrical system of the differential-only S parameter to be substantially equivalent; and reconfiguring the second electrical system from the differential-only S parameter and the second differential-only S parameter.

In a fifth aspect, there can be an electrical system as disclosed in any of the first through fourth aspects wherein the second electrical system is configured to shift propagation delay of the first electrical system to reduce differential-to-differential FEXT.

In a sixth aspect, there can be an electrical system as disclosed in any of the first through fourth aspects, wherein the second electrical system is configured to shift propagation delay of the first electrical system to reduce single-ended FEXT.

In a seventh aspect, there can be a method of manufacturing an electrical system as described in any of the first through sixth aspects.

In an eighth aspect, there is an electrical system for reducing far end crosstalk (FEXT), the electrical system comprising a first electrical system; and a second electrical system cascaded with the first electrical system in series, the second electrical system configured to compensate even-mode and odd-mode propagation delay difference of the first electrical system to reduce FEXT.

In a ninth aspect, there is an electrical system as that of the eighth aspect, wherein the first electrical system and the second electrical system are one or more of a connector, a cable, a printed circuit board (PCB), or a chip package.

In a tenth aspect, there is an electrical system as that of any of the eighth through ninth aspect, wherein the second electrical system comprises reconfigurable hardware.

In an eleventh aspect, there is an electrical system as that in the tenth aspect, wherein the reconfigurable hardware is configured by a process comprising: converting a first S parameter representative of a design of the first electrical system into a differential-only S parameter; generating a second differential-only S parameter configured to add to the even-mode propagation delay and the odd-mode propagation delay of the electrical system of the differential-only S parameter such that the total even-mode propagation delay and odd-mode propagation delay are substantially equivalent; and reconfiguring the second electrical system from the differential-only S parameter and the second differential-only S parameter.

In a twelfth aspect, there is an electrical system as that in any of the eighth through tenth aspect, wherein the second electrical system is configured to add the even-mode and odd-mode propagation delays of differential-only S parameter to the first electrical system to reduce differential-to-differential FEXT.

In a thirteenth aspect, there is an electrical system as that in any of the eighth through twelfth aspect, wherein the second electrical system is configured to add the even-mode and odd-mode propagation delays to the first electrical system to reduce single-ended FEXT.

In a thirteenth aspect, there is a method of manufacturing an electrical system for reducing differential-to-differential far end crosstalk (DDFEXT), the electrical system comprising a first electrical system; and a second electrical system cascaded with the first electrical system in series, the second electrical system configured to add even-mode and odd-mode propagation delays of differential-only S parameter to the first electrical system to reduce DDFEXT, the method comprising converting a first S parameter representative of a design of the first electrical system into a differential-only S parameter; generating a second differential-only S parameter configured to add even-mode propagation delay and odd-mode propagation delay of the differential-only S parameter of the electrical system such that the total even-mode propagation delay and odd-mode propagation delay of the differential-only S parameter are substantially equivalent; and reconfiguring the second electrical system from the differential-only S parameter and the second differential-only S parameter.

In a fourteenth aspect, there is a method as that of the thirteenth aspect, wherein the second electrical system is configured to shift propagation delay of the first electrical system to reduce differential-to-differential FEXT.

In a fifteenth aspect, there is a method of manufacturing an electrical system for reducing far end crosstalk (FEXT), the electrical system comprising a first electrical system; and a second electrical system cascaded with the first electrical system in series, the second electrical system configured to add even-mode and odd-mode propagation delays to the first electrical system to reduce FEXT, the method comprising generating a second S parameter configured to add even-mode propagation delay and odd-mode propagation delay of the electrical system such that the total even-mode propagation delay and odd-mode propagation delay are substantially equivalent; and reconfiguring the second electrical system from the S parameter and the second S parameter.

In a sixteenth aspect, there is a method as that of the fifteenth aspect, wherein the second electrical system is configured to shift propagation delay of the first electrical system to reduce single-ended FEXT.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A method of reducing differential-to-differential far end crosstalk (DDFEXT) in an electrical system, the electrical system comprising a first electrical system and a second electrical system cascaded with the first electrical system in series, the second electrical system configured to add even-mode and odd-mode propagation delays of a differential-only S parameter to the first electrical system to reduce DDFEXT, the method comprising:

converting, by a processor, a first S parameter representative of a design of the first electrical system into the differential-only S parameter;

generating, by the processor, a second differential-only S parameter configured to add even-mode propagation delay and odd-mode propagation delay of the differential-only S parameter of the electrical system such that a total even-mode propagation delay and odd-mode propagation delay of the differential-only S parameter are substantially equivalent; and reconfiguring, by the processor, the second electrical system from the differential-only S parameter and the second differential-only S parameter.

2. The method of claim 1, wherein the second electrical system is configured to shift propagation delay of the first electrical system to reduce differential-to-differential FEXT.

3. A method of reducing far end crosstalk (FEXT) in an electrical system, the electrical system comprising a first electrical system and a second electrical system cascaded with the first electrical system in series, the second electrical system configured to add even- and odd-mode propagation delays to the first electrical system to reduce FEXT, the method comprising:

generating, by a processor, a second S parameter configured to add even-mode propagation delay and odd-mode propagation delay of the electrical system such that a total even-mode propagation delay and odd-mode propagation delay are substantially equivalent; and reconfiguring, by the processor, the second electrical system from the S parameter and the second S parameter.

4. The method of claim 3, wherein the second electrical system is configured to shift propagation delay of the first electrical system to reduce single-ended FEXT.

* * * * *